United States Patent
Hsu et al.

(10) Patent No.: US 7,126,099 B2
(45) Date of Patent: Oct. 24, 2006

(54) IMAGE SENSOR WITH IMPROVED UNIFORMITY OF EFFECTIVE INCIDENT LIGHT

(75) Inventors: Hung-Jen Hsu, Jhonghe (TW); Chiu-Kung Chang, Jhudong Township, Hsinchu County (TW); Chung-Sheng Hsiung, Kaohsiung (TW); Fu-Tien Wong, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 288 days.

(21) Appl. No.: 10/649,436

(22) Filed: Aug. 26, 2003

(65) Prior Publication Data

US 2005/0045803 A1    Mar. 3, 2005

(51) Int. Cl.
*H01L 27/00* (2006.01)
*H01L 31/0232* (2006.01)
*H04N 3/14* (2006.01)
*G02B 27/10* (2006.01)

(52) U.S. Cl. ............... 250/208.1; 348/273; 257/432; 359/618

(58) Field of Classification Search ............... 257/432; 359/618, 619; 353/32; 250/208, 208.1; 348/273; 438/57

See application file for complete search history.

(56) References Cited

U.S. PATENT DOCUMENTS

| | | | |
|---|---|---|---|
| 6,255,640 B1 * | 7/2001 | Endo et al. | 250/208.1 |
| 6,638,786 B1 * | 10/2003 | Yamamoto | 438/57 |
| 6,867,920 B1 * | 3/2005 | Marom | 359/619 |
| 2002/0140832 A1 * | 10/2002 | Summa | 348/273 |

* cited by examiner

*Primary Examiner*—Georgia Epps
*Assistant Examiner*—Don Williams
(74) *Attorney, Agent, or Firm*—Thomas, Kayden, Horstemeyer & Risley

(57) ABSTRACT

An image sensor improving the uniformity of effective incident light. In one example, the size of microlenses disposed in different regions of the image sensor is changed to balance the brightness in different regions, in which the size of each microlens is a function of the distance between the microlens to the chip center In another example, the distance between the center of the microlens and the center of the corresponding sensing area is changed to balance the brightness in different regions and the corresponding color filters are shifted such that the microlens is overlying a corresponding color filter unit without overlying adjacent regions thereof, in which the distance between the center of the microlens and the center of the corresponding sensing area is a function of the distance between the corresponding sensing area to the chip center.

27 Claims, 5 Drawing Sheets

IMAGE SENSOR WITH IMPROVED UNIFORMITY OF EFFECTIVE INCIDENT LIGHT

BACKGROUND OF THE INVENTION

1. Field of the Invention

This invention relates generally to image sensors. In particular, it relates to a design for image sensor microlenses to improve uniformity of effective incident light at different regions, 2. Description of the Related Art Solid state image sensors are necessary components in many optoelectronic devices, including digital cameras, cellular phones, and toys. Conventional image sensors Include both charge coupled device (CCD) image sensors and complementary metal oxide semiconductor (CMOS) image sensors. The basic technology used to form the CMOS image sensor is common to both types sensors.

The CMOS image sensor comprises a photo detector for detecting light and a logic circuit for converting the detected light into an electric signal representing data regarding the detected light. The fill factor, sometimes referred to as the aperture efficiency, is the ratio of the size of the light-sensitive area to the size of the total pixel size. Although efforts have been made to increase the fill factor of the image sensor and thereby increase the sensor sensitivity, further increases in the fill factor are limited because the associated logic circuitry cannot be completely removed. Accordingly, in order to increase the sensitivity of the light, a microlens formation technology has been used to converge and focus the incident light onto the photo detector by changing the path of the light that reaches the lens of the photo detector. In order for the image sensor to detect and provide a color image, it typically must include both a photo detector for receiving the light and generating and accumulating charge carriers and a color filter array (CFA), i.e., a plurality of color filter units sequentially arranged above the photo detector The CFA typically uses one of two alternative three-color primary configurations, either red R, green G and blue B (PCB) or yellow Y, magenta X and cyan C (CMY). A plurality of microlenses are positioned above the color filter array to increase the photo-sensitivity of the image sensor.

In the followings a conventional CCD image device will be explained.

FIG. 1 is a cross-sectional view showing a conventional solid-state image device. In FIG. 1, reference numeral 13 represents a semiconductor substrate provided with a solid-state image sensor; 12 represents a p-well formed in the semiconductor substrate 13; 11 represents a photodiode; 10 represents a charge transfer part; 9 represents a silicon oxide or nitride film; 8 represents a polysilicon electrode; 14 represents a photo-shielding metal layer; 25 represents a surface protective coating of semiconductor elements; 19 represents a planarization layer for setting elements thereon; 24 represents a color filter array; 23 represents an intermediate transparent film; and 21 represents microlenses. Furthermore, another conventional example comprises one additional layer of metal film formed via a silicon oxide film on the photo-shielding metal layer 14 for strengthening the photo-shielding and forming a semiconductor element with the surface protective coating 25. A microlens 21 is adjusted and positioned corresponding to each photodiode, and light converged by the lens is directed to the photodiode 11 to enhance sensitivity. Among electrons and holes arising from photoenergy in the photodiode 11, the electrons are for-warded to the charge transfer part 10 by voltage applied to the polysilicon electrode 8. The transferred electrons are then forwarded to an output part by potential energy created in the charge transfer part 10 through the voltage applied to the polysilicone electrode 8.

Examples of various forms of the solid state sensor structures are to be found in the prior art. Okamoto (U.S. Pat. No. 6,545,304 B2) discloses a photoelectric converter element group on one section of a semiconductor substrate and a charge transfer path to transfer accumulated signal charge to a contiguous readout gate region having a readout gate electrode associated therewith. Umetsu et al. (U.S. Pat. No. 6,528,831 B2) discloses a solid state image pickup device in which a matrix array of photoelectric sensors are formed adjacent to charge transfer channels and wherein a read-cum-transfer electrode is formed on an insulating layer and surrounds each photoelectric element. These devices are cited here as examples of a CCD type sensor device.

In general, the image sensor is built in a chip, and the microlenses corresponding to the photo detectors are arranged in a matrix. The solid state image sensor is placed where light is converged by an optical lens and an image is formed. However, the image captured on the edge region of the matrix is darker than that in the center region.

As shown in FIG. 2, when the incident light $P_0$ transmits into the microlens 21 and through the stacked transmission layer comprising the color filter layer 27 and an IC transparent stacked layer 29 in the left pixel $P_0$ with a chief angle $\theta=0°$, the incident light $R_0$ is focused on the sensing area 11 of the photo detector. This ideal situation of a chief angle $\theta=0°$ occurs at the center region of the sensor chip 10. But if the incident light $R_1$ transmits into the microlens 21 with a chief angle $\theta$ other than 0°, the incident light reaching the photo detector may shift outside the sensing area 11. The phenomenon is especially problematic for microlenses 21 disposed near the edge region of the sensor chip 10. The pixel $P_1$ shown in the middle of FIG. 2 is between the center region and the edge region of the sensor chip 10, and the right pixel $P_2$ is arranged in the edge region. In pixels $P_1$ and $P_2$, the ideal incident light I is uniformly collimated light shown by dashed lines, while the real incident light $R_1$ and $R_2$ is shown by solid lines transmitted into the microlens 21 with chief angles $\theta_1$ and $\theta_2$, and $\theta_1<\theta_2$. Therefore, the sensing area 11 corresponding to the incident light $R_1$ and $R_2$ transmitted with a chief angle $\theta>0°$ obtains less photoenergy than the sensing area 11 corresponding to the incident light $R_0$ transmitted with a chief angle 0°.

The traditional method to resolve the issue of shift of the focus center is shifting the microlens 21 to correct the focus center of the incident light within the sensing area 11. As shown in FIG. 3, the microlens 21' before shifting is aimed at the sensing area $11_R$ of the right pixel $P_R$ and the incident light $R_b$ passing though the color filter layer $27_R$ falls outside the sensing area $11_R$. After shifting, the shifted microlens 21 can focus the incident light $R_f$ on the right pixel $P_R$. However, microlenses 21 near the boundary of the chip may be shifted so much that the incident light $R_f$ passes through the adjacent color filter layer $27_L$ and cross-talk phenomenon CT occurs in the adjacent pixels $P_L$ and $P_R$.

SUMMARY OF THE INVENTION

Accordingly, it is the object of this invention to provide an image sensor that obtains more uniform photoenergy in different regions of the chip, especially the center region and the edge region.

It is another object of this invention to provide an image sensor that avoids the cross-talk problem.

To achieve the above objects, an image sensor is designed following the condition that the size of each microlens is a function of the radial distance (hereafter referred as distance) between the microlens to a chip center. Therefore, the sizes of the microlenses are not the same so as to resolve the issue of non-uniform incident light in different regions.

In another embodiment of the present invention, an image sensor is designed following the condition that the distance between a center of the microlens and a center of a corresponding sensing area is a function of the distance between the corresponding sensing area, such as a photodiode, to a chip center, and each microlens is disposed overlying a corresponding color filter unit without overlying adjacent color filters. Therefore, the issue of non-uniform incident light is improved.

FIG, 5 shows an ideal arrangement and the modified arrangement of the microlenses, the color filter units and the photosensitive elements in the front three groups, 1, 2 and 3.

DETAILED DESCRIPTION OF THE INVENTION

First Embodiment

The incident light transmitted into the microlenses and ranching the sensing areas of an image sensor may not uniformly collimated light, especially for the regions away from the chip center. Therefore the image displayed on the edge region is darker than the center region.

The present invention provides a method improving the uniformity of effective incident light and avoiding cross-talk between adjacent pixels in a chip equipped with an image sensor so as to balance the brightness in different regions. The microlens layer consists of a plurality of microlenses corresponding to a plurality of sensing areas, respectively. The size of microlens is a function of the distance between microlens to the chip center. Specifically, the size of microlens increases as the distance between the microlens to the chip center increases.

Figure 1:
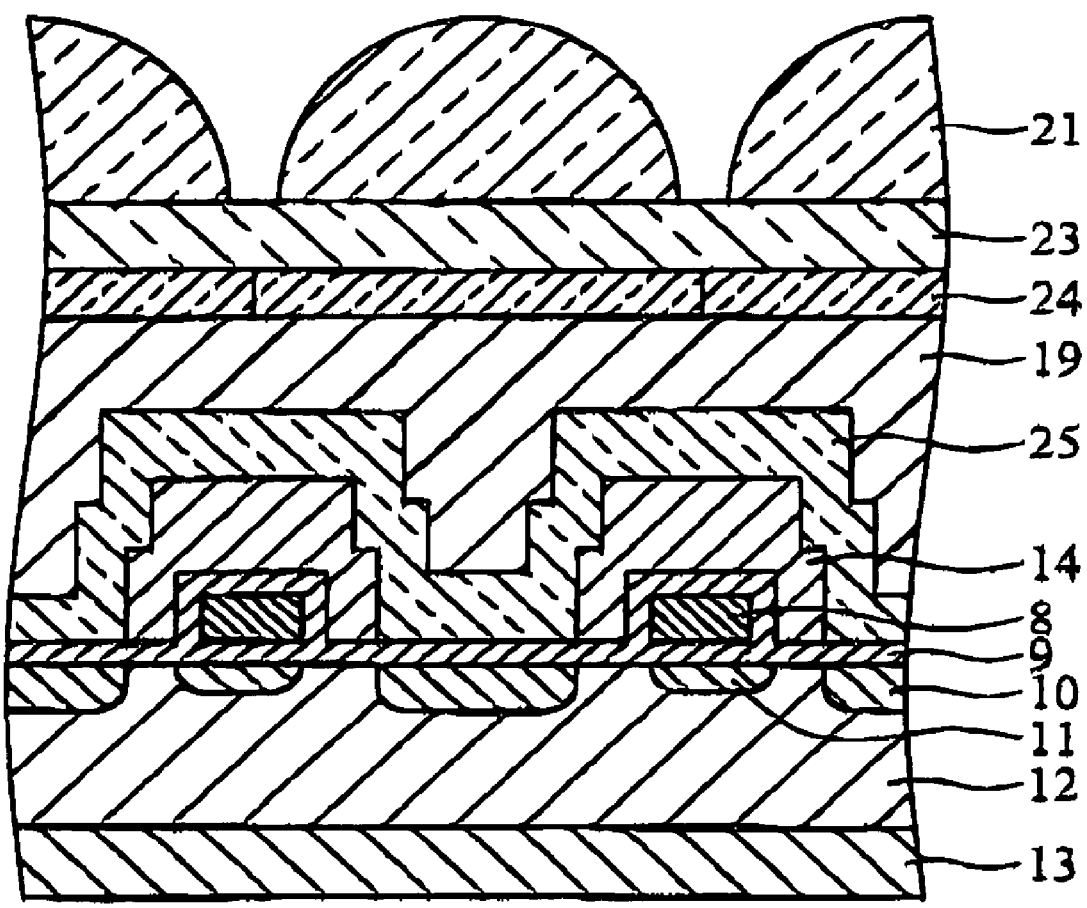
FIG. 1 is a cross-sectional view showing an image pick-up part of a conventional solid-state image device.
Figure 2:
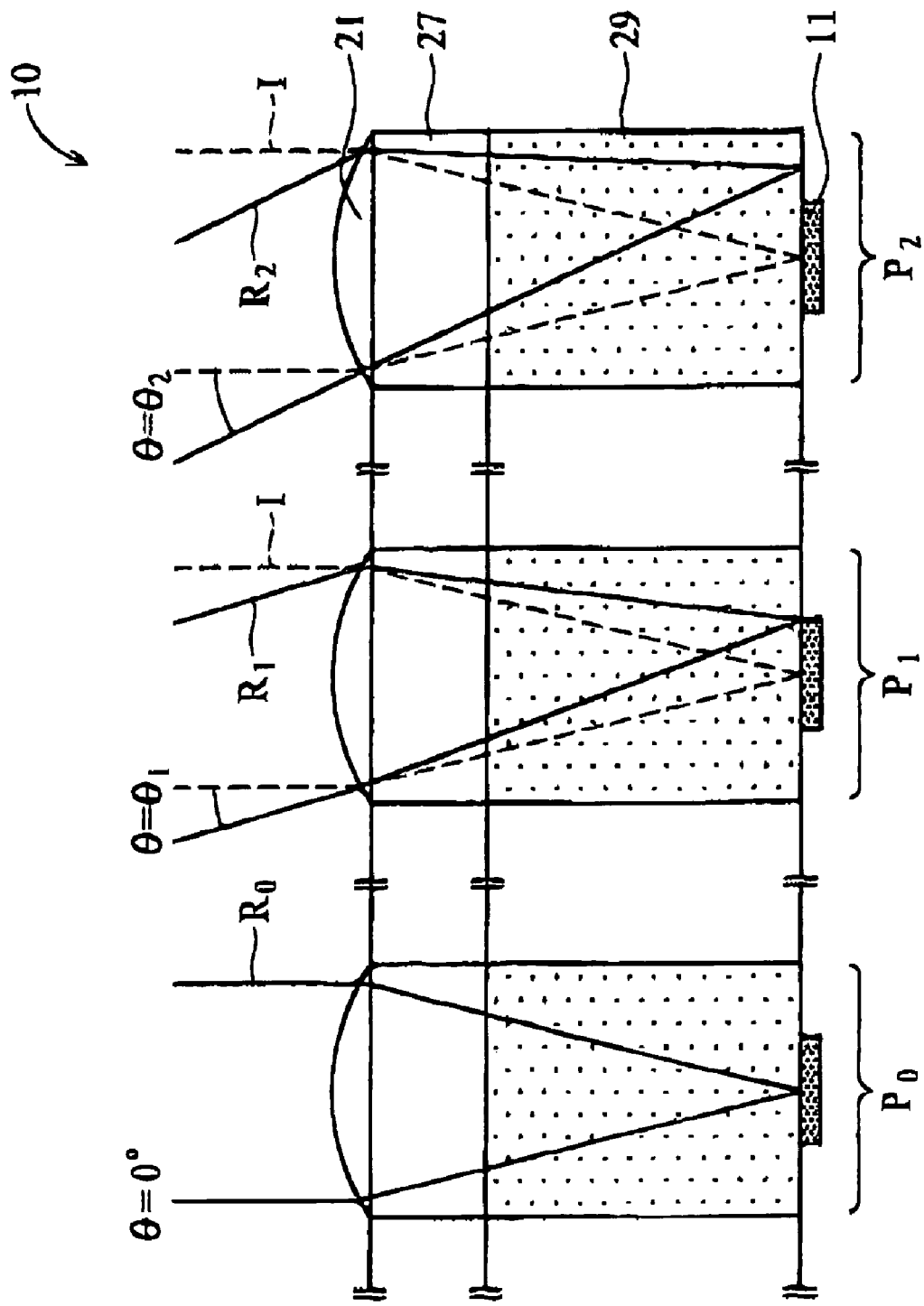
FIG. 2 shows a cross-sectional view of three pixels in which real incident light with different chief angles reaches the photo detectors in the center region, middle region and edge region of the sensor chip.
Figure 3:
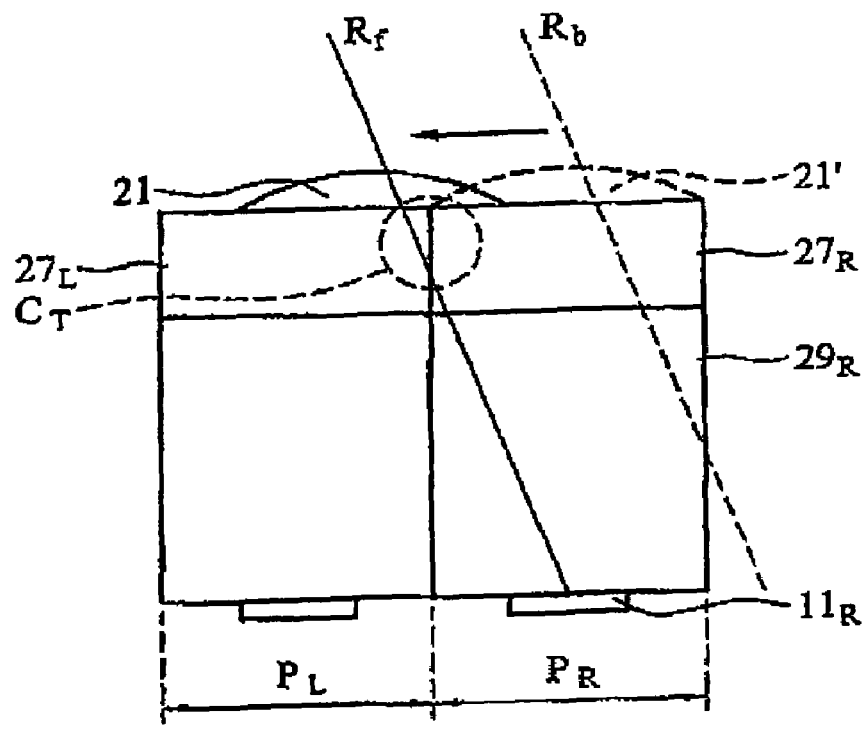
FIG. 3 is a cross-sectional view showing a microlens shifted toward the chip center resulting in cross-talk phenomenon.
Figure 4A:
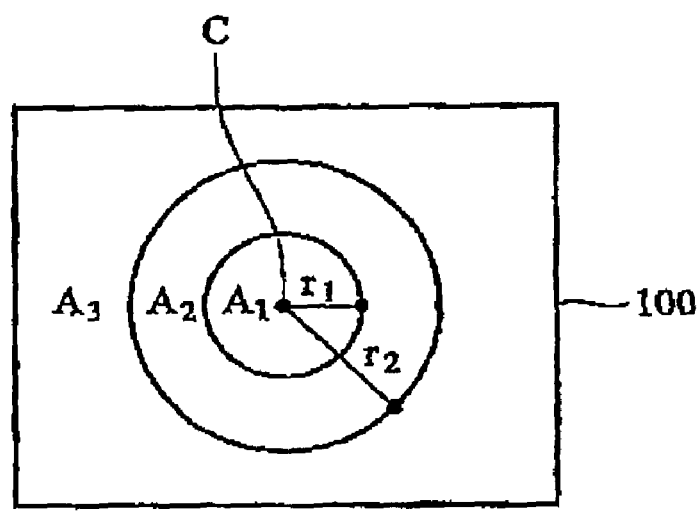
FIG. 4A shows the sensor chip divided into three regions, each equipped with one size of microlenses based on the distance of the region and the chip center in accordance with an embodiment of the present invention.

Progressively increasing the size of the microlenses from the chip center to a chip edge balances the brightness in different regions of the chip. In practice, changing the size of each microlens is not easy. Therefore, the chip maybe divided to several regions, each region having the same size of microlenses, wherein the sizes in different region are based on the distance between the region and the chip center. For example, the chip 100, as shown in FIG. 4A, has a chip center C, and is divided into three regions. The region $A_1$ is a round area from the chip center C to the radius $r_1$, the region $A_2$ is an annular area encircling the region $A_1$ from the radius $r_1$ to the radius $r_2$, and the region $A_3$ is a ringlike region encircling the region $A_2$ from the radius $r_2$ to the edge of the chip 100. The microlenses disposed in the region $A_1$, $A_2$ and $A_3$ have a constant size $S_1$, $S_2$ and $S_3$ respectively, wherein $S_1<S_2<S_3$. The photoenergy received by the sensing areas of the center region $A_1$ and the edge region $A_3$ are almost uniform resulting, in the balance of the brightness in different regions.

In order to balance the difference of the brightness, the center region may be made a little darker, or the edge region a little brighter. In the former, the microlenses disposed in the chip edge region are kept at an original size, which means the typical design without considering the difference of the chief angles, while the size of the microlenses disposed in the center region is reduced 5–50%, wherein about 20% is preferred, compared to the size of the microlenses disposed in the edge region.

Figure 4B:
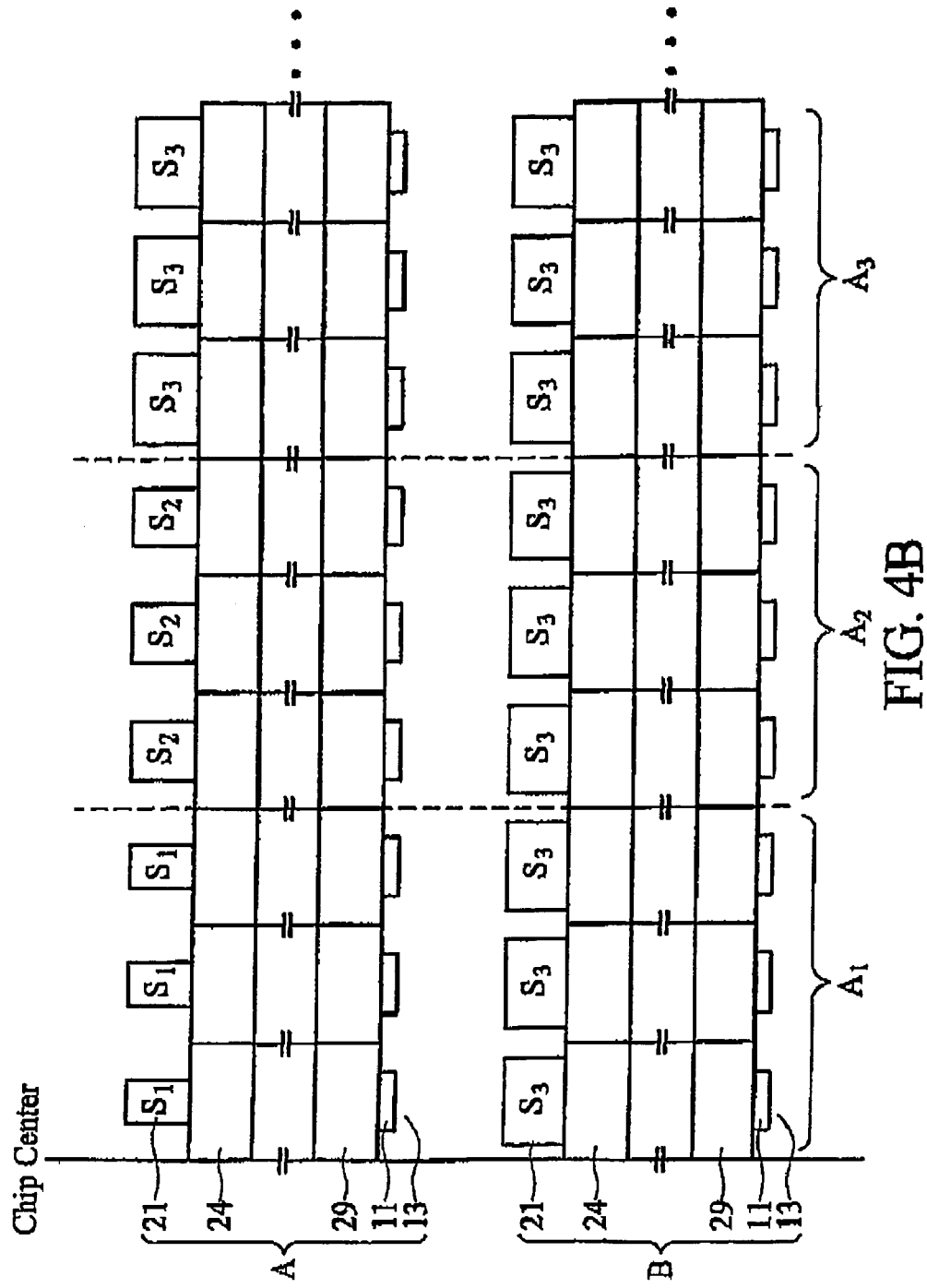
FIG. 4B shows a modified size arrangement of the microlenses 21 in the regions, $A_1$, $A_2$ and $A_3$ shown in FIG. 4A.

FIG. 4B shows a typical size arrangement (lower portion of the FIG. B) and the modified size arrangement of the present invention (upper portion of the FIG. A) of the microlenses 21 in the regions, $A_1$, $A_2$ and $A_3$ shown in FIG. 4A. The microlenses 21 are shown as simple rectangular shares. 24 represents a plurality of color filter units which constitute a color filter array of a color filter layer. 29 represents an IC staked layer.

As shown in FIG. 4B. the size $S_3$ of microlenses 21 in the region $A_3$ of the present invention are kept in the same size $S_3$ as those in the typical size arrangement B.

In the region $A_2$ the size of the microlenses 21 is reduced to $S_2$. In the region $A_1$, the size of the microlenses 21 is further reduced to $S_1$. The size $S_1$ of the microlenses 21 in the region A1 is preferably reduced by 5–50% compared with the size $S_3$ microlcnses 21 in the region $A_3$. The size $S_1$ of the microlenses 21 in the region A1 is more preferably reduced by about 20% compared with the size $S_3$ of microlenses 21 in the region $A_3$.

Second Embodiment

The present invention provides a method to improve non-uniformly effective incident light and to avoid cross-talk between adjacent pixels in a sensor chip. The microlens layer consists of a plurality of microlenses corresponding to each sensing areas The position of the microlens is a function of distance from the microlens to the chip center. Specitically, the microlens is shifted toward the chip center as the distance between the microlens and the chip center increases. If the microlens is shifted, the corresponding color filter is also shifted to make sure the incident light does not pass through the adjacent color filter.

A sensor chip with 1284×1028 pixels is given as an example. Each pixel has a width of 4 μm. The chief angle in the edge region furthest away from the chip center is 15° and the furthest microlens needs to be shifted 2.1 μm. The pixels are divided into 31 groups. The relationship between the chief angle and shifting amounts of the microlens and the color filter unit is shown in TABLE 1.

TABLE 1

| | relationship between chief angle and group shift | | |
|---|---|---|---|
| Chief angle | Shifting amount of focus center of incident light (μm) | Shifting amount of microlens and color filter unit (μm) | Group |
| 0° | 0 | 0 | 1 |
| | | 0.07 | 2 |
| 1° | 0.14 | 0.14 | 3 |
| | | 0.21 | 4 |
| 2° | 0.28 | 0.28 | 5 |
| | | 0.35 | 6 |

TABLE 1-continued relationship between chief angle and group shift

| Chief angle | Shifting amount of focus center of incident light (μm) | Shifting amount of microlens and color filter unit (μm) | Group |
|---|---|---|---|
| 3° | 0.42 | 0.42 | 7 |
|  |  | 0.49 | 8 |
| 4° | 0.56 | 0.56 | 9 |
|  |  | 0.63 | 10 |
| 5° | 0.70 | 0.70 | 11 |
|  |  | 0.77 | 12 |
| 6° | 0.84 | 0.84 | 13 |
|  |  | 0.91 | 14 |
| 7° | 0.98 | 0.98 | 15 |
|  |  | 1.05 | 16 |
| 8° | 1.12 | 1.12 | 17 |
|  |  | 1.19 | 18 |
| 9° | 1.26 | 1.26 | 19 |
|  |  | 1.33 | 20 |
| 10° | 1.40 | 1.40 | 21 |
|  |  | 1.47 | 22 |
| 11° | 1.54 | 1.54 | 23 |
|  |  | 1.61 | 24 |
| 12° | 1.68 | 1.68 | 25 |
|  |  | 1.75 | 26 |
| 13° | 1.82 | 1.82 | 27 |
|  |  | 1.89 | 28 |
| 14° | 1.96 | 1.96 | 29 |
|  |  | 2.03 | 30 |
| 15° | 2.10 | 2.10 | 31 |

Figure 5:
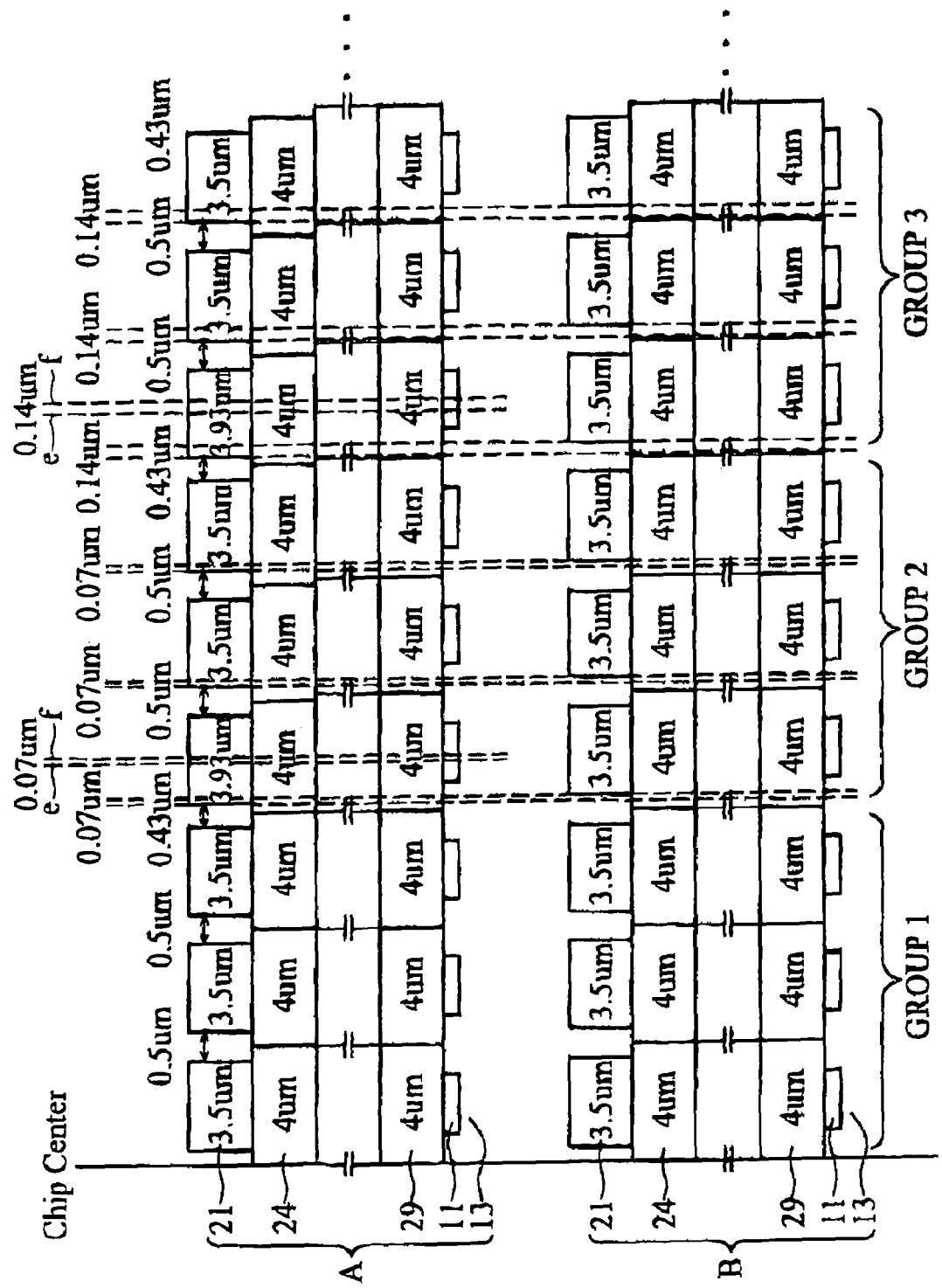

FIG. 5 shows an typical arrangement (lower portion of the figure, B) and the modified arrangement of the present invention (upper portion of the figure, A) of the microlenses 21, the color filter units 24 and the sensing areas 11 in the front three groups, 1, 2 and 3. The microlenses 21 are shown as simple rectangular shapes. 24 represents a plurality of color filter units which constitute a color filter array of a color filter layer. 29 represents an IC staked layer.

As shown in FIG. 5, the microlenses 21 and the color filter units 24 arranged in group 1 of the modified arrangement of the present invention are kept in the same position as those in the typical arrangement B.

In group 2, the microlenses 21 and the color filter units 24 are shifted toward the chip center by a distance of 0.07 μm. Therefore, the distance between the center of each microlens 21, notated as e, and the center of the corresponding sensing area 11, notated as f, is 0.07 μm. Each microlens 21 should be disposed overlying the corresponding color filter unit 24 without overlying adjacent color filter units to avoid the cross-talk issue. Therefore, if the microlens 21 is shifted, so is the corresponding color filter unit 24. The microlenses 21 in group 2 can be shifted by decreasing the gap between two adjacent microlenses 21 belonging to groups 1 and 2, while the other microlenses 21 in group 2 not adjacent to microlenses in group 1 can be shifted without decreasing the gaps there between. The color filter units 24 in group 2 can be shifted by reducing the size of the color filter unit 24 in group 2 adjacent to a color filter unit 24 belonging to group 1, while the other color filter units 24 in group 2 can be shifted without reducing their sizes.

In group 3, the microlenses 21 can be shifted by decreasing the gap between two adjacent microlenses 21 belonging to groups 2 and 3, while the other microlenses 21 in group 3 not adjacent to microlenses in group 2 can be shifted without decreasing the gaps there between. The color filter units 24 in group 3 can be shifted by reducing the size of the color filter unit 24 belonging to group 3 adjacent to the color filter unit 24 belonging to group 2, while the other color filter units 24 in group 3 can be shifted without reducing their sizes.

As is understood by a person skilled in the art, the preferred embodiments of the present invention are illustrative of the present invention rather than limiting of the present invention. Revisions and modifications may be made to methods, materials, structures and dimensions employed in fabricating a packaged image sensor having improved sensitivity, while still providing such a packaged image sensor having improved sensitivity as described herein, in accord with the spirit and scope of the present invention as defined by the appended claims.

What is claimed is:

1. An image sensor with improved uniformity of effective incident light, comprising:
    a chip having a plurality of sensing areas being capable of receiving incident radiation and a stacked transmission layer covering the sensing areas; and
    a plurality of microlenses covering the stacked transmission layer, the size of each microlens increasing as the distance between the microlens to a chip center.

2. The image sensor with improved uniformity of effective incident light of claim 1, wherein the microlenses disposed in the edge region are kept at an original size.

3. The image sensor with improved uniformity of effective incident light of claim 2, wherein the size of the microlenses disposed in the center region is reduced by 5–50% compared with the size of the microlenses disposed in the edge region.

4. The image sensor with improved uniformity of effective incident light of claim 3, wherein the size of the microlenses disposed in chip center is reduced by about 20% compared with the size of the microlenses disposed in the chip edge.

5. The image sensor with improved uniformity of effective incident light of claim 1, wherein the sizes of the microlenses are progressively increasing from the chip center to a chip edge such that the brightness in different regions of the chip is balanced.

6. The image sensor with improved uniformity of effective incident light of claim 5, wherein the difference between the sizes of the microlenses disposed in the chip center and in the chip edge is 5–50%.

7. The image sensor with improved uniformity of effective incident light of claim 6, wherein the difference between the sizes of the microlenses disposed in the chip center and in tile chip edge is about 20%.

8. The image sensor with improved uniformity of effective incident light of claim 1, wherein the microlenses are divided into a plurality of groups, and the size of the microlenses in each group is constant, wherein the sizes of the microlenses in different region increase as the distance between the corresponding region and the chip center.

9. A device comprising an image sensor of claim 1 embedded therein.

10. The image sensor with improved uniformity of effective incident light of claim 1, wherein
    the chip comprises a chip center, and further comprises a first region of a round area from the chip center to a radius $r_1$, and a second region of an annular area encircling the region $A_1$ from the radius $r_1$ to the radius $r_2$ greater than $r_1$; and
    the microlenses disposed in the first and second regions have a constant size $S_1$ and $S_2$ respectively, wherein $S_1 < S_2$.

11. The image sensor with improved uniformity of effective incident light of claim 1, wherein
the chip comprises a chip center, and further comprises a first region of a round area from the chip center to a radius $r_1$, a second region of an annular area encircling the region $A_1$ from the radius $r_1$ to the radius $r_2$ greater than $r_1$, and a third region of a ringlike region encircling the region $A_2$ from the radius $r_2$ to the edge of the chip; and
the microlenses disposed in the first, second, and third regions have a constant size $S_1$, $S_2$ and $S_3$ respectively, wherein $S_1 < S_2 < S_3$.

12. An image sensor with improved uniformity of effective incident light comprising:
a chip having a plurality of sensing areas being capable of receiving incident radiation;
a plurality of color filter units corresponding to each sensing area and disposed overlying the sensing areas; and
a plurality of microlenses overlying the color filter units, the distance between a center of the microlens and a center of the corresponding sensing area being a function of the distance between the corresponding sensing area to a chip center, each microlens overlying its corresponding color filter unit without overlying adjacent regions thereof.

13. The image sensor with improved uniformity of effective incident light of claim 12, wherein the distance between the center of each microlens and the center of the corresponding sensing area is altered based on the distance between the corresponding sensing area to a chip center such that the photoenergies received by the sensing area are more uniform.

14. The image sensor with improved uniformity of effective incident light of claim 12, wherein the distance between the center of the microlens and the center of the corresponding sensing area increases as the distance between the corresponding sensing area to the chip center increases such that the brightness in different regions of the chip is balanced.

15. The image sensor with improved uniformity of effective incident light of claim 12, wherein the microlenses are divided into a plurality of groups, and the microlenses in each group have a corresponding constant distance between the center of the microlenses and the center of the sensing area.

16. The image sensor with improved uniformity of effective incident light of claim 15, wherein the groups at least comprise a first group and a second group adjacent to the first group, the first group closer the chip center than the second group, wherein the microlenses in the second group are shifted by decreasing a gap between two adjacent microlenses belonging to the first and second groups while the other microlenses in the second group are shifted without decreasing the gaps there between, and the color filter units are shifted by reducing the size of the color filter unit belonging to the second group adjacent to another color filter unit belonging to the first group while the other color filter units in the second group are shifted without reducing their sizes.

17. The image sensor with improved uniformity of effective incident light of claim 15, wherein each group comprises at least two sensing areas.

18. The image sensor with improved uniformity of effective incident light of claim 12, further comprising an IC transparent stacked layer between the sensing areas and the color filter units.

19. A device comprising an image sensor of claim 12 embedded therein.

20. An image sensor built in a chip, comprising:
a semiconductor substrate;
a plurality of sensing areas being capable of receiving incident radiation formed in the semiconductor substrate;
a plurality of color filter units corresponding to each sensing area and disposed overlying the sensing areas; and
a plurality of microlenses overlying the color filter units, the distance between a center of the microlens and a center of the corresponding sensing area being a function of the distance between the corresponding sensing area to a chip center, each microlens overlying its corresponding color filter unit without overlying adjacent regions thereof.

21. The image sensor of claim 20, wherein the distance between the center of each microlens and the center of the corresponding sensing area is altered based on the distance between the corresponding sensing area to a chip center such that the photoenergies received by the sensing areaare more uniform.

22. The image sensor 20, wherein the distance between the center of the microlens and the center of the corresponding sensing area increases as the distance between the corresponding sensing area to the chip center increases.

23. The image sensor of claim 20, wherein the microlenses are divided into a plurality of groups, and the microlenses in each group have a corresponding constant distance between the center of the microlenses and the center of the sensing area.

24. An image sensor built in a chip, comprising:
a semiconductor substrate;
a plurality of sensing areas being capable of receiving incident radiation formed in the semiconductor substrate;
a stacked transmission layer covering the sensing areas; and
a plurality of microlenses covering the stacked transmission layer, the size of each microlens increasing as the distance between the microlens to a chip center.

25. The image sensor of claim 24, wherein the microlenses are divided into a plurality of groups, and the microlenses in each group have a corresponding constant size.

26. The image sensor of claim 24, wherein
the semiconductor substrate comprises a chip center, and further comprises a first region of a round area from the chip center to a radius $r_1$, and a second region of an annular area encircling the region $A_1$ from the radius $r_1$ to the radius $r_2$ greater than $r_1$; and
the microlenses disposed in the first and second regions have a constant size $S_1$ and $S_2$ respectively, wherein $S_1 < S_2$.

27. The image sensor of claim 24, wherein
the semiconductor substrate comprises a chip center, and further comprises a first region of a round area from the chip center to a radius $r_1$, a second region of an annular area encircling the region $A_1$ from the radius $r_1$ to the radius $r_2$ greater than $r_1$, and a third region of a ringlike region encircling the region $A_2$ from the radius $r_2$ to the edge of the semiconductor substrate; and
the microlenses disposed in the first, second, and third regions have a constant size $S_1$, $S_2$ and $S_3$ respectively, wherein $S_1 < S_2 < S_3$.

* * * * *